United States Patent
Chang et al.

(10) Patent No.: US 8,277,951 B2
(45) Date of Patent: Oct. 2, 2012

(54) DEVICE HOUSING

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Cong Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/150,362

(22) Filed: Jun. 1, 2011

(65) Prior Publication Data

US 2012/0058361 A1    Mar. 8, 2012

(30) Foreign Application Priority Data

Sep. 6, 2010 (CN) .......................... 2010 1 0273222

(51) Int. Cl.
*B32B 15/04* (2006.01)
*B32B 15/20* (2006.01)
*B32B 18/00* (2006.01)

(52) U.S. Cl. ........ 428/632; 428/633; 428/640; 428/660; 428/76; 428/215; 428/336; 428/426; 428/702

(58) Field of Classification Search .................. 428/630, 428/631, 632, 633, 639, 640, 641, 660, 681, 428/684, 685, 76, 215, 212, 213, 216, 220, 428/332, 336, 426, 432, 446, 699, 701, 702, 428/938
See application file for complete search history.

(56) References Cited

U.S. PATENT DOCUMENTS

| 6,632,535 | B1 * | 10/2003 | Buazza et al. | 428/447 |
|---|---|---|---|---|
| 2002/0086190 | A1 * | 7/2002 | Miyaura | 428/702 |
| 2006/0216498 | A1 * | 9/2006 | Chen | 428/328 |
| 2010/0159273 | A1 * | 6/2010 | Filson et al. | 428/653 |

* cited by examiner

*Primary Examiner* — Michael La Villa
(74) *Attorney, Agent, or Firm* — Altis Law Group, Inc.

(57) ABSTRACT

A device housing is provided. The device housing includes a substrate, a barrier layer formed on the substrate, an illuminating layer formed on the barrier layer, and a protective layer formed on the illuminating layer. The barrier layer is made of titanium. The illuminating layer is made of rare-earth aluminates. The protective layer is made of silica dioxide. A method for making the device housing is also described there.

4 Claims, 1 Drawing Sheet

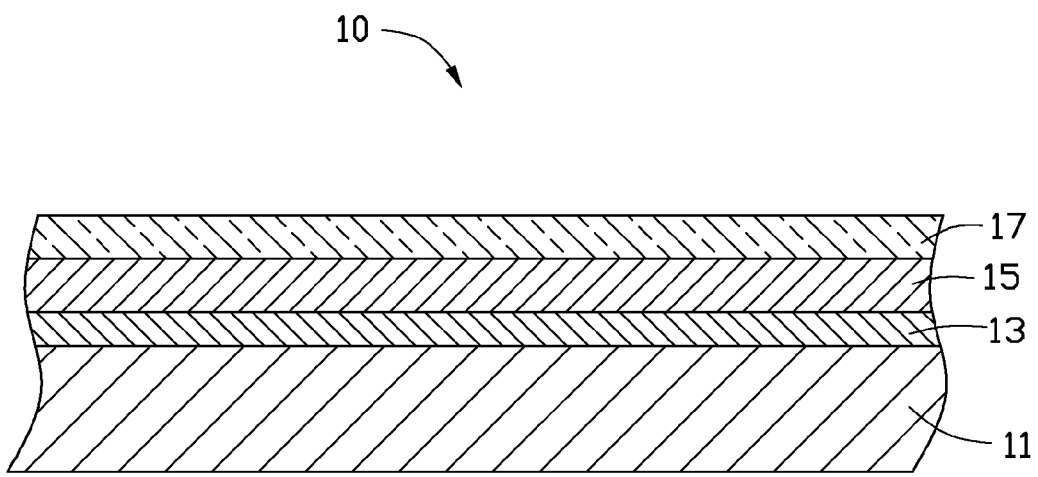

DEVICE HOUSING

BACKGROUND

1. Technical Field

The present disclosure relates to device housings, particularly to an device housing having an illuminable property and a method for making the device housing.

2. Description of Related Art

Many electronic device housings are coated with an illuminating layer to attract consumers. These illuminating layers are commonly printed with ink or painted with a paint that contains fluorescent materials. However, the illuminating layers have a weak luminous intensity due to uneven distribution of the fluorescent materials, which may scatter and absorb light. Furthermore, the printing or painting process for forming the illuminating layer may not be environmentally friendly.

Therefore, there is room for improvement within the art.

BRIEF DESCRIPTION OF THE FIGURE

Many aspects of the device housing can be better understood with reference to the following FIGURE. The components in the FIGURE are not necessarily drawn to scale, the emphasis instead being placed upon clearly illustrating the principles of the device housing.

The FIGURE is a cross-sectional view of an exemplary embodiment of a device housing.

DETAILED DESCRIPTION

The FIGURE shows a device housing 10 according to an exemplary embodiment. The device housing 10 includes a substrate 11, a barrier layer 13, an illuminating layer 15, and a protective layer 17 formed on a surface of the substrate 11 and in that order.

The substrate 11 may be made of stainless steel or any other iron based alloys.

The barrier layer 13 may include titanium or may be a titanium layer formed by vacuum sputtering. The barrier layer 13 may have a thickness of about 100 nm-200 nm.

The illuminating layer 15 may include rare-earth aluminates, or may be a rare-earth aluminates layer. The rare-earth aluminates may be one or more ingredients selected from a group consisting of strontium europium aluminates ($SrAl_2O_4$:Eu), strontium dysprosium aluminates ($SrAl_2O_4$:Dy), calcium europium aluminates ($CaAl_2O_4$:Eu), and calcium dysprosium aluminates ($CaAl_2O_4$:Dy). The illuminating layer 15 may be formed by vacuum evaporation. The thickness of the illuminating layer 15 may be about 5 μm-10 μm.

When irradiated (by visible or invisible light), some electrons of Eu or Dy within the illuminating layer 15 jump from low-energy state to unstable high-energy state. When the irradiation stops, the unstable high-energy electrons jump back to the low-energy state, simultaneously releasing light energy, and brightly illuminating the illuminating layer 15.

Additionally, the barrier layer 13 there prevents the iron or any other alloy elements within the substrate 11 from weakening the illuminating property of the illuminating layer 15 by blocking the iron or any other alloy elements transiting to the illuminating layer 15.

The protective layer 17 may include optically transparent silica dioxide ($SiO_2$), or may be an optically transparent $SiO_2$ layer formed by vacuum evaporation. The protective layer 17 has a thickness of about 100 nm-500 nm. The protective layer 17 protects the illuminating layer 15 from abrasion. Additionally, the protective layer 17 is glossy and often considered by consumers as more aesthetically pleasing compared to ink or paint layers.

A method for making the device housing 10 may include the following steps:

The substrate 11 is pre-treated. The pre-treating process may include the step of cleaning the substrate 11 in an ultrasonic cleaning device (not shown) filled with ethanol or acetone.

The substrate 11 is plasma cleaned. The substrate 11 may be positioned in a plating chamber of a vacuum sputtering equipment (not shown). The plating chamber is fixed with a titanium target therein. The plating chamber is then evacuated to about $4.0 \times 10^{-3}$ Pa. Argon (Ar, having a purity of about 99.999%) may be used as a working gas and is injected into the chamber at a flow rate of about 300 standard-state cubic centimeters per minute (sccm)-500 sccm. The substrate 11 may be biased with negative bias voltage at a range of −200V−−800 V, then high-frequency voltage is produced in the plating chamber and the Ar is ionized to plasma. The plasma then strikes the surface of the substrate 11 to clean the surface of the substrate 11. Plasma cleaning the substrate 11 may take about 3 minutes (min)-10 min. The plasma cleaning process will enhance the bond between the substrate 11 and the barrier layer 13. The titanium target is unaffected by the plasma cleaning process.

The barrier layer 13 is vacuum sputtered on the plasma treated substrate 11. Vacuum sputtering of the barrier layer 13 is implemented in the plating chamber of the vacuum sputtering equipment. The inside of the plating chamber is heated to about 100° C.-200° C. The flow rate of Ar may be adjusted to about 20 sccm-150 sccm. Power is applied to the titanium target fixed in the plating chamber and adjusted to about 2 kilowatt (KW)-4 KW, and the substrate 11 may have a negative bias voltage of about −100V−−300V to deposit the barrier layer 13 on the substrate 11. Depositing of the barrier layer 13 may take about 20 min-40 min.

The illuminating layer 15 is formed on the barrier layer 13 by vacuum evaporation. Vacuum evaporation depositing of the illuminating layer 15 is implemented in a plating chamber of a vacuum evaporative equipment (not shown). The substrate 11 having the barrier layer 13 is positioned in the plating chamber. The plating chamber is then evacuated to about $5.3 \times 10^{-3}$ Pa. The evaporation target for deposition the illuminating layer 15 may be one or more ingredients selected from a group consisting of $SrAl_2O_4$:Eu, $SrAl_2O_4$:Dy, $CaAl_2O_4$:Eu, and $CaAl_2O_4$:Dy. The evaporation target may be electron-beam heated to evaporate and deposit on the barrier layer 13 to form the illuminating layer 15. The depositing rate of the illuminating layer 15 may be about 3 angstrom per second (Å/S)-10 Å/S. During the depositing process, the surface of the barrier layer 13 may be bombarded by plasma at a power of about 900 W-1500 W to enhance the bond between the barrier layer 13 and the illuminating layer 15. The plasma may be produced by a plasma producer.

The protective layer 17 is formed on the illuminating layer 15 by vacuum evaporation. To deposit the protective layer 17, the silica dioxide is used as an evaporative target, and the silica dioxide is electron-beam heated. The depositing rate of the protective layer 17 may be about 3 Å/S -10 Å/S.

It is to be understood that during the depositing of protective layer 17, the surface of the illuminating layer 15 may also be bombarded by plasma at a power of about 900 W-1500 W to enhance the bond between the illuminating layer 15 and the protective layer 17.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A device housing, comprising:
   a substrate;
   a barrier layer formed on the substrate, the barrier layer comprising titanium atoms;
   an illuminating layer formed on the barrier layer, the illuminating layer comprising rare-earth aluminate; and
   a protective layer formed on the illuminating layer, the protective layer comprising silicon dioxide;
   wherein the barrier layer blocks elements within the substrate from moving to the illuminating layer, the barrier layer is formed by vacuum sputtering and wherein the barrier layer has a thickness of about 100 nm to about 200 nm.

2. A device housing, comprising:
   a substrate;
   a barrier layer formed on the substrate, the barrier layer comprising titanium atoms;
   an illuminating layer formed on the barrier layer, the illuminating layer comprising rare-earth aluminate; and
   a protective layer formed on the illuminating layer, the protective layer comprising silicon dioxide;
   wherein the barrier layer blocks elements within the substrate from moving to the illuminating layer and wherein the rare-earth aluminate is one or more ingredients selected from a group consisting of strontium europium aluminate, strontium dysprosium aluminate, calcium europium aluminate, and calcium dysprosium aluminate.

3. The device housing as claimed in claim 2, wherein the illuminating layer is formed by vacuum evaporation.

4. The device housing as claimed in claim 3, wherein the illuminating layer has a thickness of about 5 μm to about 10 μm.

* * * * *